United States Patent
Lee et al.

(10) Patent No.: US 11,558,026 B2
(45) Date of Patent: Jan. 17, 2023

(54) BULK-ACOUSTIC WAVE RESONATOR (71) Applicant: Samsung Electro-Mechanics Co., Ltd., Suwon-si (KR)

(72) Inventors: Tae Kyung Lee, Suwon-si (KR); Sang Heon Han, Suwon-si (KR); Ran Hee Shin, Suwon-si (KR); Jin Suk Son, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 308 days.

(21) Appl. No.: 16/875,225

(22) Filed: May 15, 2020

(65) Prior Publication Data
US 2021/0119599 A1  Apr. 22, 2021

(30) Foreign Application Priority Data
Oct. 17, 2019  (KR) .................. 10-2019-0128802

(51) Int. Cl.
*H03H 9/02* (2006.01)
*H03H 9/17* (2006.01)
*H03H 9/13* (2006.01)

(52) U.S. Cl.
CPC .... *H03H 9/02102* (2013.01); *H03H 9/02031* (2013.01); *H03H 9/13* (2013.01); *H03H 9/173* (2013.01); *H03H 9/176* (2013.01)

(58) Field of Classification Search
CPC .. H03H 9/02102; H03H 9/02031; H03H 9/13; H03H 9/173; H03H 9/176; H03H 9/02118; H03H 9/02047
See application file for complete search history.

(56) References Cited

U.S. PATENT DOCUMENTS

| | | | | |
|---|---|---|---|---|
| 2010/0052112 | A1* | 3/2010 | Rogers | B81B 7/0093 438/584 |
| 2018/0145655 | A1 | 5/2018 | Tsutsumi et al. | |
| 2018/0254764 | A1 | 9/2018 | Lee et al. | |
| 2022/0149806 | A1* | 5/2022 | Lee | H03H 9/175 |

FOREIGN PATENT DOCUMENTS

| | | |
|---|---|---|
| JP | 4835238 B2 | 12/2011 |
| JP | 2018-85651 A | 5/2018 |
| KR | 10-2018-0101129 A | 9/2018 |

* cited by examiner

*Primary Examiner* — Jeffrey M Shin
(74) *Attorney, Agent, or Firm* — NSIP Law (57) ABSTRACT

A bulk-acoustic wave resonator may include: a substrate; a resonator unit including a first electrode disposed on the substrate, a piezoelectric layer disposed on the first electrode, and a second electrode disposed on the piezoelectric layer; and a protective layer disposed on a surface of the resonator unit. The protective layer is formed of a diamond film, and a grain size of the diamond film is 50 nm or more.

18 Claims, 10 Drawing Sheets

BULK-ACOUSTIC WAVE RESONATOR

CROSS-REFERENCE TO RELATED APPLICATIONS

This application claims the benefit under 35 U.S.C. § 119(a) of Korean Patent Application No. 10-2019-0128802 filed on Oct. 17, 2019 in the Korean Intellectual Property Office, the entire disclosure of which is incorporated herein by reference for all purposes.

BACKGROUND

1. Field

The following description relates to a bulk-acoustic wave resonator.

2. Description of Related Art

In accordance with the trend for miniaturization of wireless communication devices, miniaturization of high frequency component technology is desired. For example, a bulk-acoustic wave (BAW) type filter using a semiconductor thin film wafer manufacturing technology may be used.

A bulk-acoustic resonator (BAW) is that a thin film type element including a piezoelectric dielectric material disposed on a silicon wafer, which is a semiconductor substrate. The BAW causes resonance using piezoelectric characteristics of the piezoelectric dielectric material. The BAW may be implemented as a filter.

Recently, technology interest in 5G communication has been increasing, and development of technologies that can be implemented in candidate bands of 5G communication is underway.

However, in the case of 5G communication using the Sub 6 GHz (4 to 6 GHz) frequency band, since the bandwidth is increased and the communication distance is shortened, the strength or power of the signal of the bulk-acoustic wave resonator may be increased.

When the power of the bulk-acoustic wave resonator increases, the temperature of the resonator tends to increase linearly. Therefore, a bulk-acoustic wave resonator capable of effectively dissipating heat generated by the resonator is advantageous.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk-acoustic wave resonator includes: a substrate; a resonator unit including a first electrode disposed on the substrate, a piezoelectric layer disposed on the first electrode, and a second electrode disposed on the piezoelectric layer; and a protective layer disposed on a surface of the resonator unit. The protective layer is formed of a diamond film, and a grain size of the diamond film is 50 nm or more.

The piezoelectric layer may be formed of aluminum nitride (AlN) or aluminum nitride containing scandium (Sc).

The second electrode may be formed of molybdenum (Mo).

The first electrode and the second electrode may extend outside of the resonator unit. A first metal layer may be disposed on the first electrode outside of the resonator unit, and a second metal layer maybe disposed on the second electrode outside of the resonator unit. At least a portion of the protective layer may be disposed to contact the first metal layer and the second metal layer.

At least a portion of the protective layer may be disposed below the first metal layer and below the second metal layer.

A region of the protective layer disposed below the first metal layer or below the second metal layer may be thicker than a region of the protective layer disposed in the resonator unit.

The first metal layer and the second metal layer may be formed of any one of gold (Au), a gold-tin (Au—Sn) alloy, copper (Cu), a copper-tin (Cu—Sn) alloy, aluminum (Al), and an aluminum alloy.

The second electrode may have at least one opening. A portion of the protective layer may be disposed in the at least one opening, and may directly contact the piezoelectric layer.

The second electrode may have at least one opening. A portion of the piezoelectric layer may be disposed in the at least one opening, and may directly contact the protective layer.

The bulk-acoustic wave resonator may further include a support portion disposed below the piezoelectric layer, and partially raising the piezoelectric layer such that the portion of the piezoelectric layer is disposed in the at least one opening.

The protective layer may be formed of a material having a thermal conductivity higher than a thermal conductivity of the piezoelectric layer and a thermal conductivity of the second electrode.

The bulk-acoustic wave resonator may further include an insertion layer partially disposed in the resonator unit, and disposed between the first electrode and the piezoelectric layer. At least a portion of the piezoelectric layer may be raised by the insertion layer.

The second electrode may have at least one opening. The insertion layer may further include a support portion disposed in a region corresponding to a region of the opening.

The insertion layer may further include an inclined surface. The piezoelectric layer may include a piezoelectric portion disposed on the first electrode, and an inclined portion disposed on the inclined surface.

In a cross-section of the resonator unit, an end of the second electrode may be disposed on the inclined portion, or disposed along a boundary between the piezoelectric portion and the inclined portion.

The piezoelectric layer may further include an extension portion disposed outside of the inclined portion. At least a portion of the second electrode may be disposed on the extension portion.

The grain size of the diamond film may be less than 1 µm.

The bulk-acoustic wave resonator may further include: a first metal layer disposed on the first electrode outside of the resonator unit; and a second metal layer disposed on the second electrode outside of the resonator unit. A first end portion of the protective layer may be disposed directly between the first metal layer and the piezoelectric layer. A second end portion of the protective layer may be disposed directly between the second metal layer and the second electrode.

Other features and aspects will be apparent from the following detailed description, the drawings, and the claims.

Throughout the drawings and the detailed description, the same drawing reference numerals refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 1:
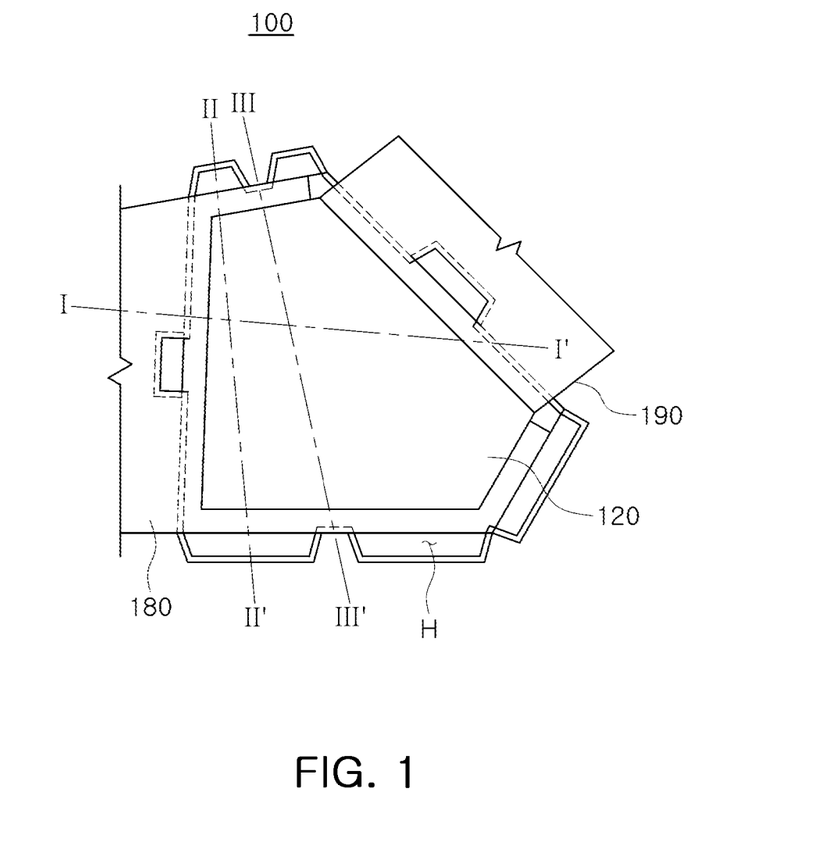
FIG. 1 is a plan view of a bulk-acoustic wave resonator, according to an embodiment.
Figure 2:
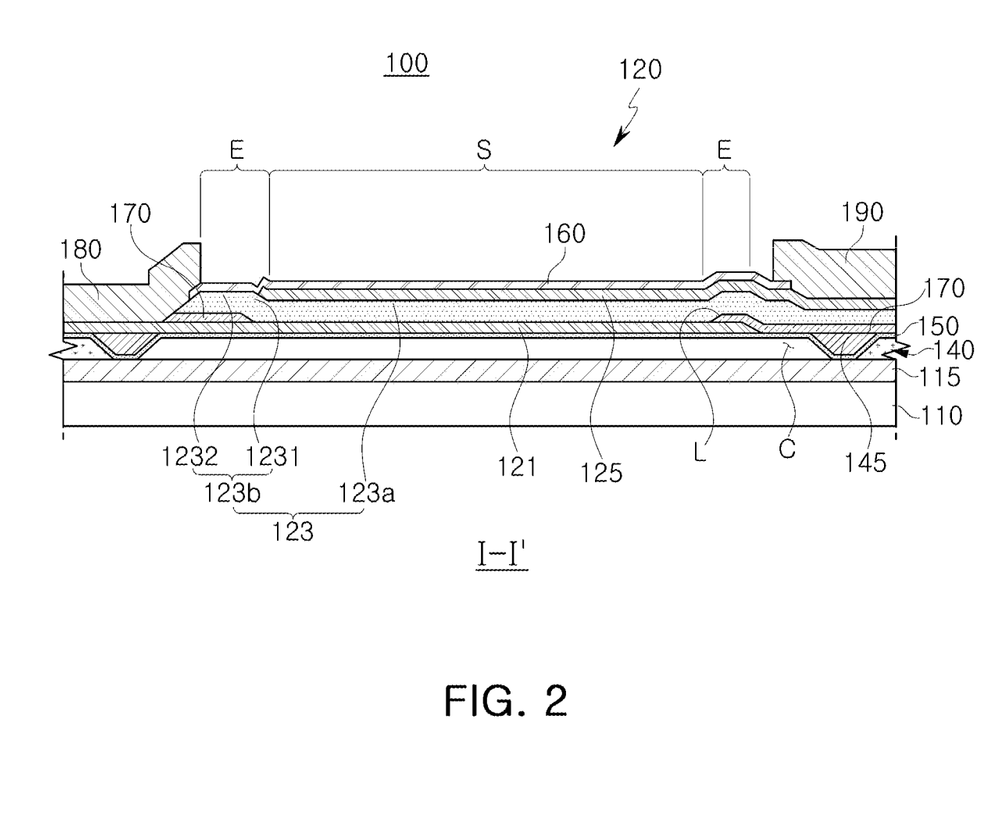
FIG. 2 is a cross-sectional view taken along line I-I' of FIG. 1.
Figure 3:
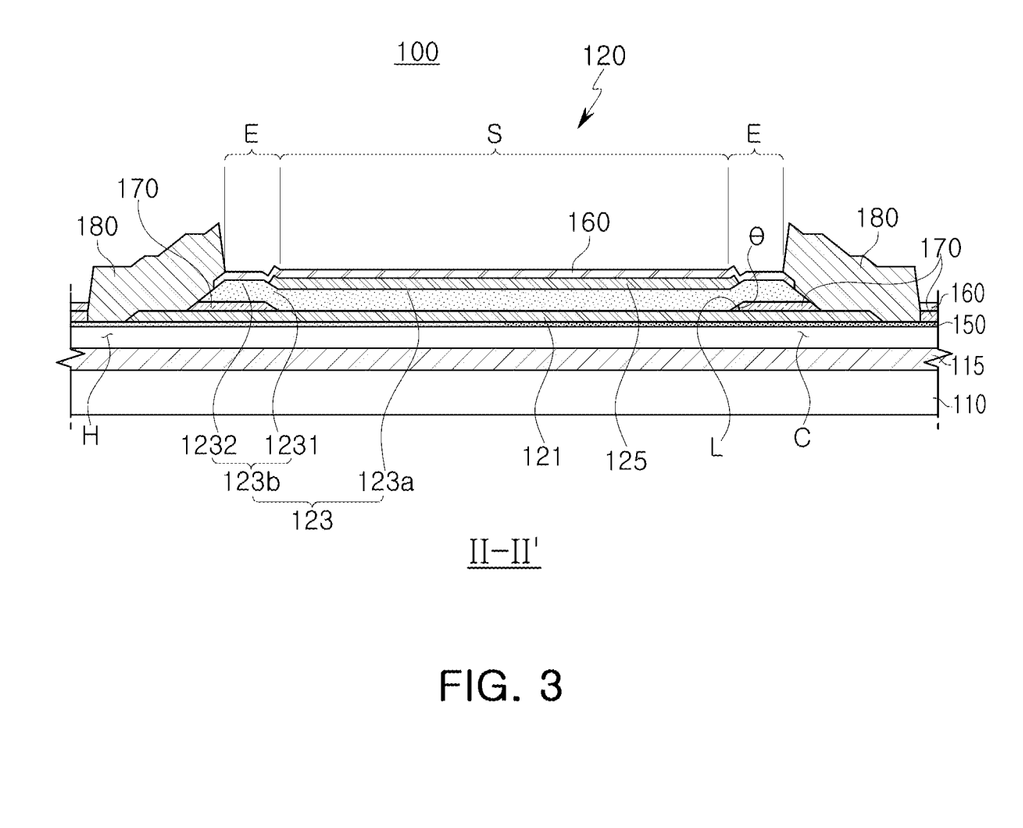
FIG. 3 is a cross-sectional view taken along line II-II' of FIG. 1.
Figure 4:
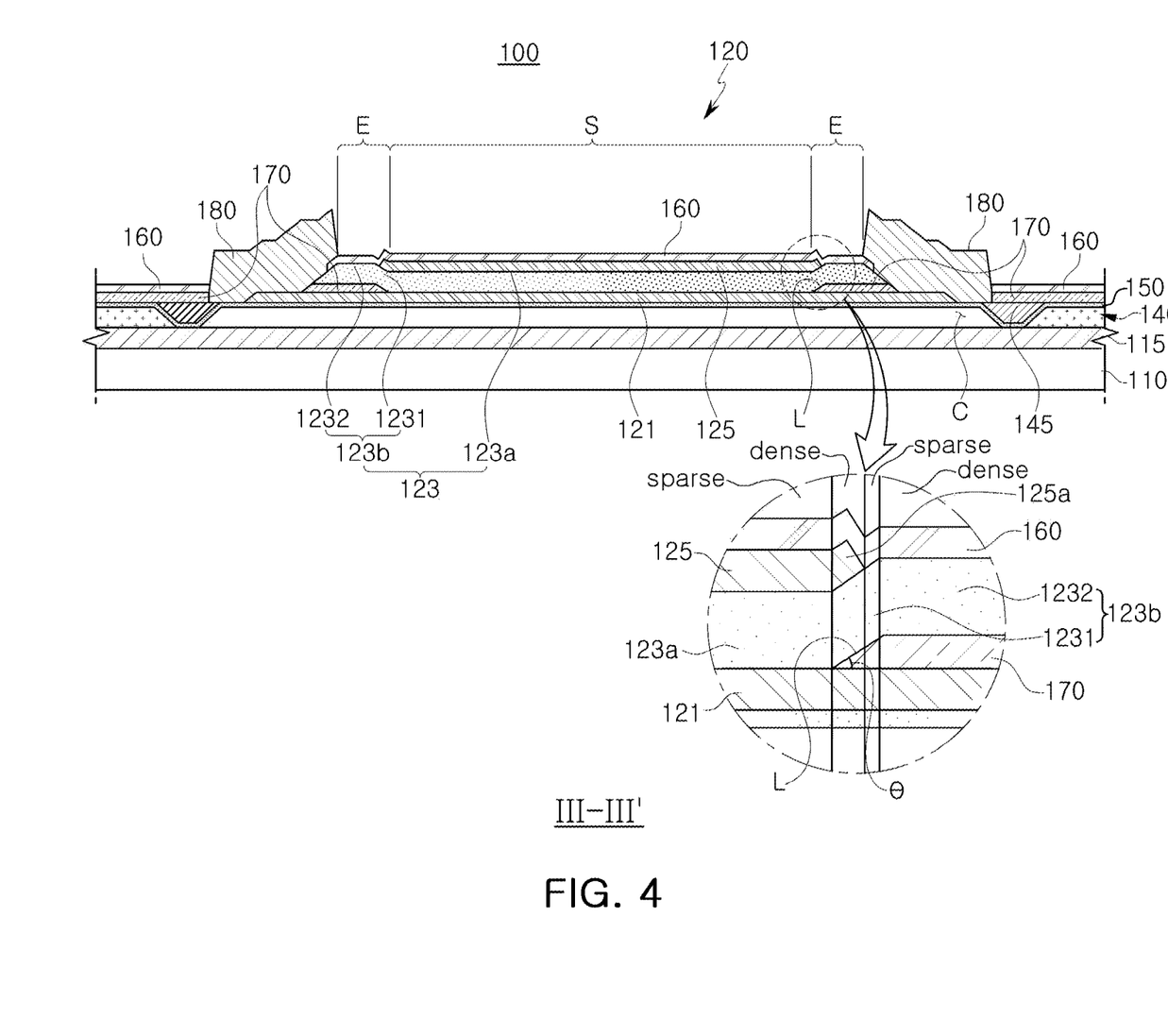
FIG. 4 is a cross-sectional view taken along line III-III' in FIG. 1.

FIG. 1 is a plan view of an acoustic wave resonator 100, according to an embodiment. FIG. 2 is a cross-sectional view taken along line I-I' of FIG. 1. FIG. 3 is a cross-sectional view taken along line II-II' of FIG. 1. FIG. 4 is a cross-sectional view taken along line III-III' of FIG. 1.

Referring to FIGS. 1 to 4, the acoustic wave resonator 100 may be a bulk acoustic wave (BAW) resonator, and may include a substrate 110, a sacrificial layer 140, a resonator unit 120, and an insertion layer 170.

The substrate 110 may be a silicon substrate. For example, a silicon wafer or a silicon on insulator (SOI) type substrate may be used as the substrate 110.

An insulating layer 115 may be provided on an upper surface of the substrate 110 to electrically isolate the substrate 110 and the resonator unit 120. In addition, the insulating layer 115 prevents the substrate 110 from being etched by an etching gas when a cavity C is formed in a manufacturing process of the acoustic-wave resonator 100.

In an example, the insulating layer 115 may be formed of any one or any combination of any two or more of silicon dioxide ($SiO_2$), silicon nitride ($Si_3N_4$), aluminum oxide ($Al_2O_3$), and aluminum nitride (AlN), and may be formed through any one of chemical vapor deposition, RF magnetron sputtering, and evaporation.

For example, a sacrificial layer 140 is formed on the insulating layer 115, and the cavity C and an etch stop portion 145 are disposed in the sacrificial layer 140.

The cavity C is formed as an empty space, and may be formed by removing a portion of the sacrificial layer 140.

As the cavity C is formed in the sacrificial layer 140, a portion of the resonator unit 120 formed above the sacrificial layer 140 may be formed to be entirely flat.

The etch stop portion 145 is disposed along a boundary of the cavity C. The etch stop portion 145 is provided to prevent etching from being performed beyond a cavity region in a process of forming the cavity C.

A membrane layer 150 is formed on the sacrificial layer 140, and forms an upper surface of the cavity C. Therefore, the membrane layer 150 may also be formed of a material that is not easily removed in the process of forming the cavity C.

For example, in an example in which a halide-based etching gas such as fluorine (F), chlorine (Cl), or the like is used to remove a portion (e.g., a cavity region) of the sacrificial layer 140, the membrane layer 150 may be made of a material having low reactivity with the etching gas. In this case, the membrane layer 150 may include either one or both of silicon dioxide ($SiO_2$) and silicon nitride ($Si_3N_4$).

In addition, the membrane layer 150 may be made of a dielectric layer containing any one or any combination of any two or more of magnesium oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), or a metal layer containing any one or any combination of any two or more of aluminum (Al), nickel (Ni), chromium (Cr), platinum (Pt), gallium (Ga), and hafnium (Hf). However, the membrane is not limited to the foregoing examples.

The resonator unit 120 includes, for example, a first electrode 121, a piezoelectric layer 123, and a second electrode 125. The resonator unit 120 may be configured such that the first electrode 121, the piezoelectric layer 123, and the second electrode 125 are stacked in order from a bottom of the resonator unit 120. Therefore, the piezoelectric layer 123 may be disposed between the first electrode 121 and the second electrode 125.

Since the resonator unit 120 is formed on the membrane layer 150, the membrane layer 150, the first electrode 121, the piezoelectric layer 123, and the second electrode 125 are sequentially stacked on the substrate 110, to form the resonator unit 120.

The resonator unit 120 may resonate the piezoelectric layer 123 according to signals applied to the first electrode 121 and the second electrode 125 to generate a resonant frequency and an anti-resonant frequency.

The resonator unit 120 may include a central portion S in which the first electrode 121, the piezoelectric layer 123, and the second electrode 125 are stacked to be substantially flat, and an extension portion E in which an insertion layer 170 is interposed between the first electrode 121 and the piezoelectric layer 123.

The central portion S is a region disposed in a center of the resonator unit 120, and the extension portion E is a region disposed along a periphery of the central portion S. Therefore, the extension portion E is a region extending outwardly from the central portion S, and is a region formed to have a continuous annular shape along the periphery of the central portion S. However, if necessary, the extension portion E may be configured to have a discontinuous annular shape, in which some regions are disconnected from one another.

Accordingly, as shown in FIG. 2, in the cross-section of the resonator unit 120 cut so as to cross the central portion S, the extension portion E is disposed on both ends of the central portion S, respectively. The insertion layer 170 is disposed on portions of the extension portion E disposed on both ends of the central portion S.

The insertion layer 170 has an inclined surface L of which a thickness increases as a distance from the central portion S increases.

In the extension portion E, the piezoelectric layer 123 and the second electrode 125 are disposed on the insertion layer 170. Therefore, portions of the piezoelectric layer 123 and the second electrode 125 located in the extension portion E have an inclined surface along the shape of the insertion layer 170.

In the embodiment of FIGS. 1-4, the extension portion E is included in the resonator unit 120, and accordingly, resonance may also occur in the extension portion E. However, the disclosure is not limited to this configuration. Depending on the structure of the extension portion E, resonance may not occur in the extension portion E and may occur only in the central portion S.

The first electrode 121 and the second electrode 125 may be formed of a conductor, for example, gold, molybdenum, ruthenium, iridium, aluminum, platinum, titanium, tungsten, palladium, tantalum, chromium, nickel, or a metal containing any one or any combination of any two or more of gold, molybdenum, ruthenium, iridium, aluminum, platinum, titanium, tungsten, palladium, tantalum, chromium, and nickel. However, the first electrode 121 and the second electrode 125 are not limited to the foregoing examples.

In the resonator unit 120, the first electrode 121 may be formed to have a larger area than that of the second electrode 125, and a first metal layer 180 may be disposed along a periphery of the first electrode 121 on the first electrode 121. Therefore, the first metal layer 180 may be disposed to be spaced apart at a predetermined distance from the second electrode 125, and may be disposed in a form surrounding the resonator unit 120.

Since the first electrode 121 is disposed on the membrane layer 150, the first electrode 121 is formed to be entirely flat. On the other hand, since the second electrode 125 is disposed on the piezoelectric layer 123, the second electrode 125 may be formed to be bent corresponding to the shape of the piezoelectric layer 123.

The first electrode 121 may be configured as an input electrode or an output electrode for inputting or outputting, respectively, an electrical signal such as a radio frequency (RF) signal.

The second electrode 125 may be disposed throughout an entirety of the central portion S, and disposed in a portion of the extension portion E. Accordingly, the second electrode 125 include a portion disposed on a piezoelectric portion 123a of the piezoelectric layer 123 to be described later, and a portion disposed on a bent portion, or bent portion 123b of the piezoelectric layer 123.

For example, in the embodiment of FIGS. 1-4, the second electrode 125 is disposed to cover an entirety of the piezoelectric portion 123a and a portion of an inclined portion 1231 of the piezoelectric layer 123. Accordingly, the a portion 125a (FIG. 4) of the second electrode 125 disposed in the extension portion E is formed to have an area smaller than an area of an inclined surface of the inclined portion 1231, and the second electrode 125 is formed to have an area in the resonator unit 120 that is smaller than an area of the piezoelectric layer 123 in the resonator unit 120.

Accordingly, as shown in FIG. 2, in a cross-section of the resonator unit 120 cut so as to cross the central portion S, an end of the second electrode 125 is disposed in the extension portion E. In addition, at least a portion of the end of the second electrode 125 disposed in the extension portion E is disposed to overlap the insertion layer 170. Here, 'overlap' means that when the second electrode 125 is projected on a plane on which the insertion layer 170 is disposed, a shape of the second electrode 125 projected on the plane overlaps the insertion layer 170.

The second electrode 125 may be configured as an input electrode or an output electrode for inputting or outputting, respectively, an electrical signal such as a radio frequency (RF) signal, or the like. That is, when the first electrode 121 is configured as the input electrode, the second electrode 125 may be configured as the output electrode, and when the first electrode 121 is configured as the output electrode, the second electrode 125 may be configured as the input electrode.

As illustrated in FIG. 4, when the end of the second electrode 125 is positioned on the inclined portion 1231 of the piezoelectric layer 123 to be described later, since a local structure of an acoustic impedance of the resonator unit 120 is formed in a sparse/dense/sparse/dense structure from the central portion S, a reflective interface reflecting a lateral wave inwardly of the resonator unit 120 is increased. Therefore, since most lateral waves cannot flow outwardly of the resonator unit 120, and are reflected and then flow to an interior of the resonator unit 120, the performance of the acoustic resonator 100 may be improved.

The piezoelectric layer 123 is a portion configured to convert electrical energy into mechanical energy in a form of elastic waves through a piezoelectric effect, and is formed on the first electrode 121 and the insertion layer 170 to be described later.

Zinc oxide (ZnO), aluminum nitride (AlN), doped aluminum nitride, lead zirconate titanate, quartz, and the like can be selectively used as a material of the piezoelectric layer 123. In the case of doped aluminum nitride, a rare earth metal, a transition metal, or an alkaline earth metal may be further included. The rare earth metal may include any one or any combination of any two or more of scandium (Sc), erbium (Er), yttrium (Y), and lanthanum (La). The transition metal may include any one or any combination of any two or more of hafnium (Hf), titanium (Ti), zirconium (Zr), tantalum (Ta), and niobium (Nb). In addition, the alkaline earth metal may include magnesium (Mg).

In order to improve piezoelectric properties, when a content of doping elements doped in aluminum nitride (AlN) is less than 0.1 at %, a piezoelectric property higher than that of aluminum nitride (AlN) cannot be realized. When the content of the elements exceeds 30 at %, it is difficult to fabricate and control the composition for deposition, such that uneven crystalline phases may be formed.

Therefore, in an embodiment according to this disclosure, the content of doping elements doped in aluminum nitride (AlN) may be in a range of 0.1 to 30 at %.

In an embodiment, the piezoelectric layer 123 is doped with scandium (Sc) in aluminum nitride (AlN). In this case, a piezoelectric constant may be increased to increase $K_t^2$ of the acoustic resonator.

As described above, the piezoelectric layer 123 includes a piezoelectric portion 123a disposed in the central portion S and the bent portion 123b disposed in the extension portion E. The piezoelectric portion 123a is a portion directly stacked on the upper surface of the first electrode 121. Therefore, the piezoelectric portion 123a is interposed between the first electrode 121 and the second electrode 125 to be formed in a flat shape, together with the first electrode 121 and the second electrode 125. The bent portion 123b may be a region extending outwardly from the piezoelectric portion 123a and positioned in the extension portion E.

The bent portion 123b is disposed on the insertion layer 170, to be described later, and is formed in a shape in which the upper surface thereof is raised along the shape of the insertion layer 170. Accordingly, the piezoelectric layer 123 is curved, or bent, at a boundary between the piezoelectric portion 123a and the bent portion 123b, and the bent portion 123b is raised corresponding to the thickness and shape of the insertion layer 170.

The bent portion 123b may include an inclined portion 1231 and an extension portion 1232.

The inclined portion 1231 is a portion formed to be inclined along an inclined surface L of the insertion layer 170. The extension portion 1232 is a portion extending outwardly from the inclined portion 1231.

The inclined portion 1231 may be formed parallel to the inclined surface L of the insertion layer 170, and an inclination angle of the inclined portion 1231 may be the same as an inclination angle of the inclined surface L of the insertion layer 170.

The insertion layer 170 is disposed along a surface formed by the membrane layer 150, the first electrode 121, and the etch stop portion 145. Therefore, the insertion layer 170 is partially disposed in the resonator unit 120, and is disposed between the first electrode 121 and the piezoelectric layer 123.

The insertion layer 170 is disposed around the central portion S to support the bent portion 123b of the piezoelectric layer 123. Accordingly, the bent portion 123b of the piezoelectric layer 123 may include the inclined portion 1231 and the extension portion 1232 along the shape of the insertion layer 170.

In the embodiment of FIGS. 1-4, the insertion layer 170 is disposed in a region excluding the central portion S. For example, the insertion layer 170 may be disposed on the substrate 110 in an entire region except for the central portion S, or in some regions excluding the central portion S.

The insertion layer 170 is formed to have a thickness that increases as a distance from the central portion S increases. Thereby, the insertion layer 170 is formed to have a side surface, disposed adjacent to the central portion S, that includes the inclined surface L having a constant inclination angle θ.

If the inclination angle θ of the inclined surface L of the insertion layer 170 were formed to be smaller than 5°, the insertion layer 170 would be difficult to implement, since the thickness of the insertion layer 170 would formed to be very thin or an area of the inclined surface L would be formed to be excessively large.

In addition, if the inclination angle θ of the inclined surface L of the insertion layer 170 were formed to be greater than 70°, the inclination angle of the piezoelectric layer 123 or the second electrode 125 stacked on the insertion layer 170 would also be formed to be greater than 70°. In this case, since the piezoelectric layer 123 or the second electrode 125 stacked on the inclined surface L would be excessively bent or curved, cracks may be generated in the bent portion 123b.

Therefore, according to an embodiment, the inclination angle θ of the inclined surface L is formed to be greater than or equal to 5° and less than or equal to 70°.

The inclined portion 1231 of the piezoelectric layer 123 may be formed along the inclined surface L of the insertion layer 170, and thus may be formed at the same inclination angle as the inclined surface L of the insertion layer 170. Therefore, the inclination angle of the inclined portion 1231 may also be formed to be greater than or equal to 5° and less than or equal to 70°, similarly to the inclined surface L of the insertion layer 170. The configuration may also be equally applied to the portion of the second electrode 125 stacked on the inclined surface L of the insertion layer 170.

The insertion layer 170 may be formed of a dielectric material such as silicon oxide (SiO$_2$), aluminum nitride (AlN), aluminum oxide (Al$_2$O$_3$), silicon nitride (Si$_3$N$_4$), magnesium oxide (MgO), zirconium oxide (ZrO$_2$), lead zirconate titanate (PZT), and gallium Arsenic (GaAs), hafnium oxide (HfO$_2$), titanium oxide (TiO$_2$), or zinc oxide (ZnO), but may be formed of a material different from that of the piezoelectric layer 123.

In addition, the insertion layer 170 may be implemented with a metal material. When the acoustic wave resonator 100 is used for 5G communication, a lot of heat is generated by the resonator unit 120, and thus heat generated by the resonator unit 120 needs to be smoothly released. To this end, the insertion layer 170 may be made of an aluminum alloy material containing scandium (Sc).

The resonator unit 120 is disposed to be spaced apart from the substrate 110 through a cavity C formed as an empty space.

The cavity C may be formed by removing a portion of a sacrificial layer 140 by supplying an etching gas (or an etching solution) to an inlet hole (H in FIG. 1) in a process of manufacturing the acoustic resonator 100.

A protective layer 160 is disposed along the upper surface of the acoustic resonator 100 to protect the acoustic resonator 100 from the outside. The protective layer 160 may be disposed along a surface formed by the second electrode 125 and the bent portion 123b of the piezoelectric layer 123.

For example, in the embodiment of FIGS. 1-4, the protective layer 160 is formed of a diamond material having excellent thermal conductivity. Diamond is a material made by crystallization of carbon elements at high temperature and pressure, and is known as a material having the superior thermal conductivity in comparison to various other materials. Diamond crystals have an excellent thermal conductivity of about 2000 W/m·K, and are suitable for a material of an acoustic device because diamond crystals have the largest speed of sound among known materials.

However, when diamond material is implemented as a thin film rather than a crystal, there is a problem in that the thermal conductivity of the diamond material becomes low.

Figure 5:
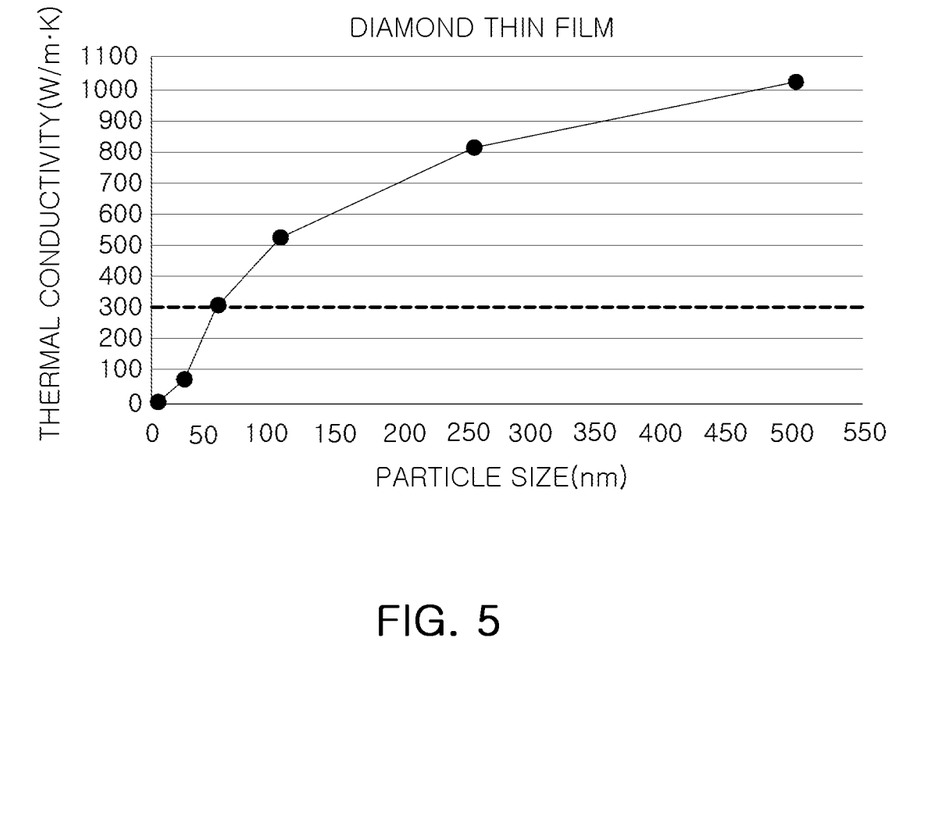
FIG. 5 is a graph illustrating thermal conductivity according to a grain size of a diamond thin film, according to an example.

FIG. 5 is a graph illustrating the thermal conductivity according to a grain size of a diamond thin film. Referring to FIG. 5, diamond tends to increase in thermal conductivity as the grain size thereof increases. Diamond grain size can be measured through surface analysis of the protective layer 160. For example, the size of grains can be determined from a point above the protective layer 160 using a high magnification (higher than 50,000× magnification) scanning electron microscope, and the diamond grain size can be taken from the average size value of multiple grains.

Diamond can be thinned through chemical vapor deposition (CVD) to form a diamond thin film, and a degree of crystallization of diamond in the deposition process determines the grain size of the diamond thin film.

If the grain size of the diamond thin film is 50 nm or more, the diamond thin film may have a higher thermal conductivity than the piezoelectric layer 123 made of a material of aluminum nitride (AlN) or the second electrode 125 made of a material of molybdenum (Mo).

However, when the grain size of the diamond thin film is 1 μm or more, scattering of sound waves increases as the surface roughness increases, so a diamond thin film having a grain size of 1 μm or more may not be suitable for FBAR a film bulk acoustic resonator (FBAR). In this case, a process for reducing the surface roughness may be additionally performed, but it is difficult to achieve the desired surface roughness.

Therefore, according to an embodiment, the grain size of the diamond thin film is formed to be greater than or equal to 50 nm and less than 1 μm.

As described above, when the diamond thin film has a higher thermal conductivity than the piezoelectric layer 123 and the second electrode 125, since heat generated in an active region of the resonator unit 120 may be rapidly emitted through the protective layer 160 formed of the diamond thin film, it is possible to lower a maximum temperature of the resonator unit 120.

The acoustic resonator 100 according to the embodiment of FIGS. 1-4 exhibits a temperature distribution in which a temperature in the central region is the highest and a temperature decreases toward the outer side from the central region of the resonator unit 120, based on the plan view illustrated in FIG. 1.

In a conventional acoustic resonator, SiO$_2$ and Si$_3$N$_4$ are mainly used as the material of the protective layer. These materials have very low thermal conductivity, and as a result, heat dissipation from the resonator unit is not smoothly performed. For example, in a case in which the material of the protective layer was formed of Si$_3$N$_4$, the maximum temperature in the central region of the resonator unit was measured to be 179° C.

On the other hand, in an example in which the material of the protective layer 160 was formed of a diamond thin film, and the same power applied to the conventional acoustic resonator was applied to the acoustic resonator 100, the maximum temperature in the central region of the resonator unit 120 was measured to be 74°, which was significantly lowered in comparison to the resonator unit of the conventional acoustic resonator. Therefore, it can be understood that the temperature is rapidly emitted through the protective layer 160.

The protective layer 160 configured as described above may be formed as a single layer, but may be formed by stacking two layers having different materials as necessary. In addition, the protective layer 160 may be partially removed to adjust a frequency in a final process of manufacturing the acoustic resonator 100. For example, the thickness of the protective layer 160 may be adjusted in the manufacturing process.

The first electrode 121 and the second electrode 125 may include extended portions extending outside the resonator unit 120. In addition, the first metal layer 180 and the second metal layer 190 may be disposed on the upper surface of the extended portions of the first electrode 121 and the second electrode 125, respectively.

For example, the first metal layer 180 and the second metal layer 190 may be made of any material among gold (Au), a gold-tin (Au—Sn) alloy, copper (Cu), a copper-tin (Cu—Sn) alloy, and aluminum (Al), an aluminum alloy. The aluminum alloy may be an aluminum-germanium (Al—Ge) alloy or an aluminum-scandium (Al—Sc) alloy, for example.

The first metal layer 180 and the second metal layer 190 may function as a connection wiring electrically connecting the electrodes 121 and 125 of the acoustic resonator 100 to the electrodes of other acoustic resonators disposed adjacent to each other on the substrate 110.

The first metal layer 180 penetrates the protective layer 160 and is bonded to the first electrode 121.

In addition, in the resonator unit 120, the first electrode 121 may be formed to have an area larger than an area of the second electrode 125, and the first metal layer 180 may be formed on the periphery of the first electrode 121.

Therefore, the first metal layer 180 may be disposed along the periphery of the resonator unit 120, and thus is disposed in a form surrounding the second electrode 125. However, the acoustic resonator 100 is not limited to this configuration.

In addition, the protective layer 160 is disposed such that at least a portion of the protective layer 160 contacts the first metal layer 180 and the second metal layer 190. The first metal layer 180 and the second metal layer 190 may be formed of a metal material having a high thermal conductivity and have a large volume, such that the first metal layer 180 and the second metal layer 190 have a large heat dissipation effect.

Therefore, the protective layer 160 is connected to the first metal layer 180 and the second metal layer 190, such that heat generated in the piezoelectric layer 123 may be quickly transferred to the first metal layer 180 and the second metal layer 190 via the protective layer 160.

In an example, at least a portion of the protective layer 160 is disposed below the first metal layer 180 and the second metal layer 190. For example, the protective layer 160 is inserted and disposed between the first metal layer 180 and the piezoelectric layer 123, and between the second metal layer 190 and a portion of the second electrode 125 disposed on the piezoelectric layer 123.

As described above, the bulk-acoustic wave resonator 100 includes the protective layer 160 formed of a diamond thin film having a grain size of more than 50 nm. In addition, at least a portion of the diamond thin film is configured to directly contact the first metal layer 180 and the second metal layer 190.

Accordingly, heat generated from the piezoelectric layer 123 is transferred to the first and second metal layers 180 and 190 through the protective layer 160, which has a relatively high thermal conductivity, and thus is emitted, thereby increasing a heat dissipation effect. Accordingly, even if high power is applied to the resonator unit 120, operational reliability can be ensured. Therefore, the acoustic resonator 100 may be utilized as a bulk-acoustic wave resonator suitable for 5G communication.

However, the disclosure is not limited to the above-described embodiment, and various modifications are possible.

Figure 6:
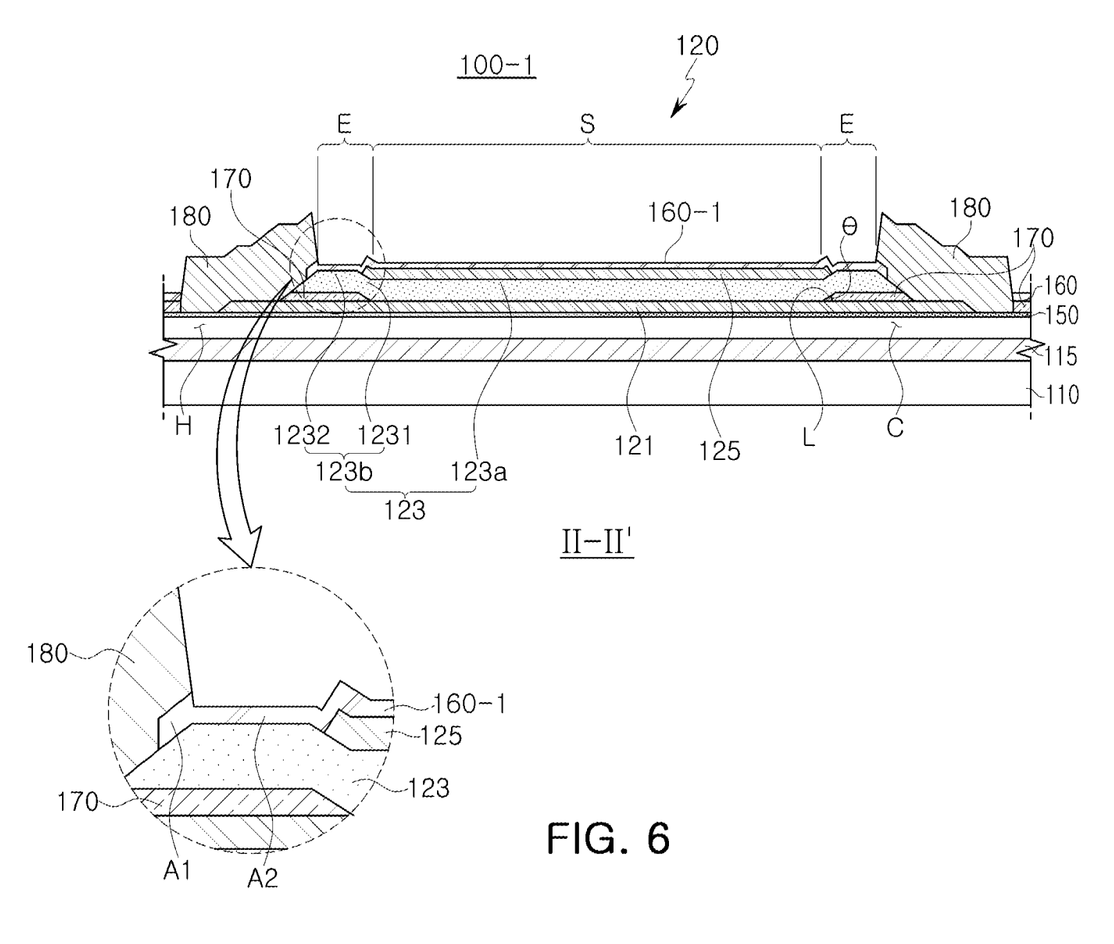
FIG. 6 is a cross-sectional view schematically illustrating a bulk-acoustic wave resonator, according an embodiment.

FIG. 6 is a cross-sectional view schematically illustrating an acoustic wave resonator 100-1, according to an embodiment.

Referring to FIG. 6, in the acoustic wave resonator 100-1, a protective layer 160-1 is divided into a first region A1 and a second region A2.

The first region A1 is a region disposed below the first metal layer 180 and below the second metal layer 190, and having a thickness greater than a thickness of the second region A2. The second region A2 is a region that excludes the first region A1, is disposed in the resonator unit 120, and has a thickness less than a thickness of the first region A1.

Such a configuration may be implemented by forming the entire protective layer 160-1 to a thickness of the first region A1, and then partially removing the second region A2.

The thicker the protective layer 160-1 formed of a diamond thin film becomes, the more grain growth occurs. Thus, it is possible to obtain an effect of increasing the grain size. Therefore, forming a greater thickness is advantageous for improving the thermal conductivity of the protective layer 160-1.

The protective layer 160-1 has the same grain size as the first region A1 throughout the entire protective layer 160-1, even though the second region A2 has a reduced thickness in comparison to the first region A1. Thus, the protective layer 160-1 may have high thermal conductivity throughout its structure.

Figure 7:
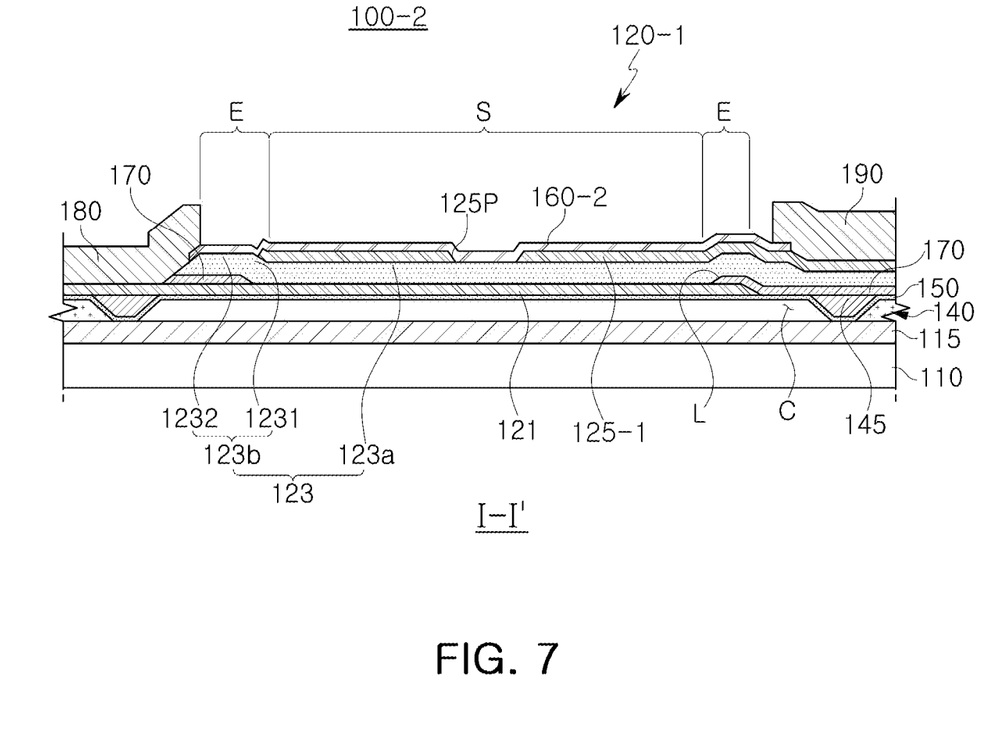
FIG. 7 is a cross-sectional view schematically illustrating a bulk-acoustic wave resonator, according to an embodiment.

FIG. 7 is a cross-sectional view schematically illustrating an acoustic wave resonator 100-2, according to an embodiment.

Referring to FIG. 7, a second electrode 125-1 of a resonator unit 120-1 of the acoustic wave resonator 100-2 has at least one opening 125P. The opening 125P is disposed in the central portion of the second electrode 125-1, and a protective layer 160-2 disposed on the second electrode 125-1 is disposed within the opening 125P to directly contact the piezoelectric layer 123.

The acoustic wave resonator 100-2 has the highest temperature in the central portion of the resonator unit 120-1 during operation. Therefore, if the heat generated in the central portion of the resonator unit 120-1 can be quickly emitted, an overall temperature of the resonator unit 120-1 can be lowered.

Accordingly, the acoustic wave resonator 100-2 is configured such that the piezoelectric layer 123, which is a heating element, directly contacts the protective layer 160-2 in the central portion of the resonator unit 120-1. In this case, the heat generated from the piezoelectric layer 123 is directly transferred to the protective layer 160-2 having high thermal conductivity, so that heat can be more effectively discharged outside the resonator unit 120-1, and thus a heat dissipation effect of the resonator unit 120-1 may be entirely improved.

When an area of the opening 125P occupies more than 10% of the area of the resonator unit 120, a driving region of the resonator unit 120-1 decreases, resulting in $K_t^2$ reduction and deterioration of insertion loss characteristics. Therefore, in an embodiment, the opening 125P is formed to have an area that is 10% or less of the area of the resonator unit 120-1.

Figure 8:
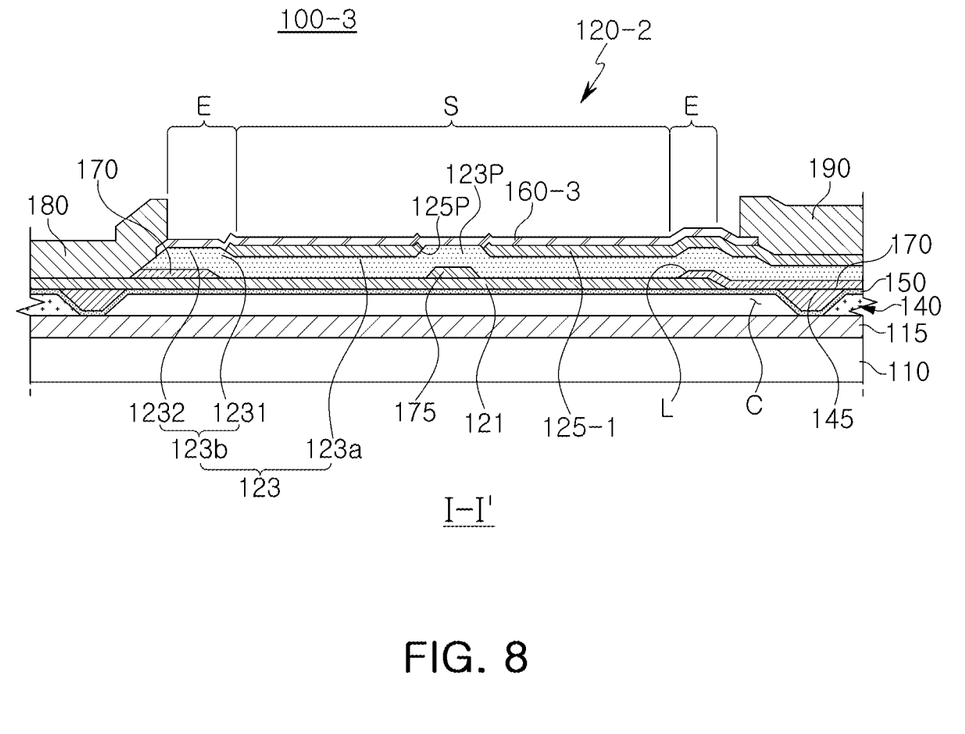
FIG. 8 is a cross-sectional view schematically illustrating a bulk-acoustic wave resonator, according to an embodiment.

FIG. 8 is a cross-sectional view schematically illustrating an acoustic wave resonator 100-3 including a resonator unit 120-2, according to an embodiment.

Referring to FIG. 8, the opening 125P is formed in a central portion of the second electrode 125-1. In addition, a piezoelectric layer 123-1 is disposed in the opening 125P to directly contact a protective layer 160-3.

To this end, a support portion 175 may be disposed below a region of the piezoelectric layer 123-1 corresponding to a region of the opening 125P. The region of the piezoelectric layer 123-1 corresponding to the region of the opening 125P is a region overlapping the region of the projected opening 125P when the opening 125P is projected onto a plane on which the insertion layer 170 is disposed.

The support portion 175 is disposed below the piezoelectric layer 123-1 to partially raise the piezoelectric layer 123-1 and causes the piezoelectric layer 123-1 to be disposed inside the opening 125P. More specifically, the piezoelectric layer 123-1 includes a raised portion 123P that is raised along the shape of the support portion 175 and is disposed in the opening 125P.

A side surface of the raised portion 123P may be formed as an inclined surface, and the opening 125P of the second electrode 125-1 is disposed along the inclined surface of the raised portion 123P. In this case, as illustrated in FIG. 8, an end portion of the second electrode 125-1 forming the opening 125P may be disposed on the inclined surface of the raised portion 123P. Accordingly, an entirety of an upper surface of the raised portion 123P may be configured to contact the protective layer 160-3. In addition, a portion of the inclined surface, which is the side surface of the raised portion 123P, may be configured to contact the protective layer 160-3. However, the acoustic wave resonator 100-3 is not limited to this configuration.

The support portion 175 may be formed as a portion of the insertion layer 170 described above. For example, in the process of forming the insertion layer 170, the support portion 175 may be formed of the same material as the insertion layer 170. However, the disclosure is not limited to such a formation process, and it is also possible to form the support portion 175 separately from the insertion layer 170. In such a case, the support portion 175 may be formed of a material different from that of the insertion layer 170, but is not limited to being formed of the different material.

In addition, in the embodiment of FIG. 8, it is illustrated that the support portion 175 is disposed between the first electrode 121 and the piezoelectric layer 123-1, but the support portion 175 may also be disposed between the membrane layer 150 and the first electrode 121 as necessary.

Figure 9:
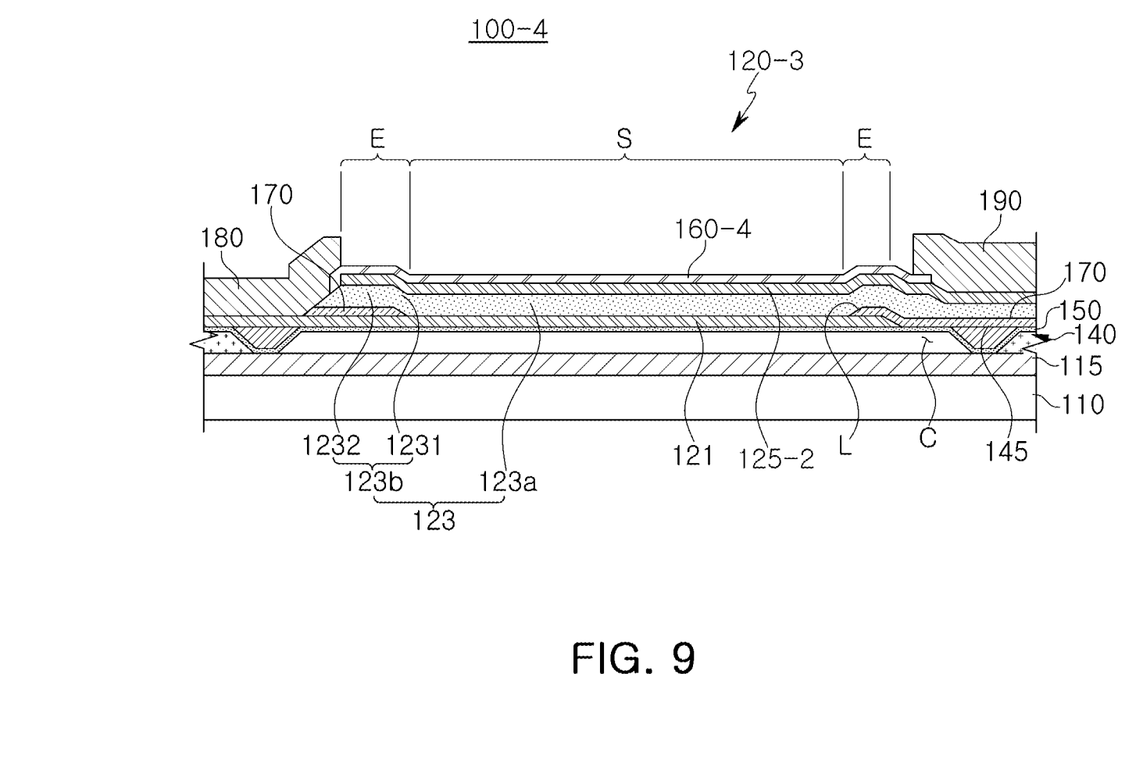
FIG. 9 is a cross-sectional view schematically illustrating a bulk-acoustic wave resonator, according to an embodiment.

FIG. 9 is a cross-sectional view schematically illustrating an acoustic wave resonator 100-4, according to an embodiment.

In acoustic wave resonator 100-4, a second electrode 125-2 is disposed on the entire upper surface of the piezoelectric layer 123 within a resonator unit 120-3, and accordingly, the second electrode 125-2 is formed not only on the inclined portion 1231 of the piezoelectric layer 123 but also on the extension portion 1232. A protective layer 160-4 may be disposed on the second electrode 125-2, and may include an edge portion inserted between the first metal layer and side surfaces of the second electrode 125-2 and the piezoelectric layer 123.

Figure 10:
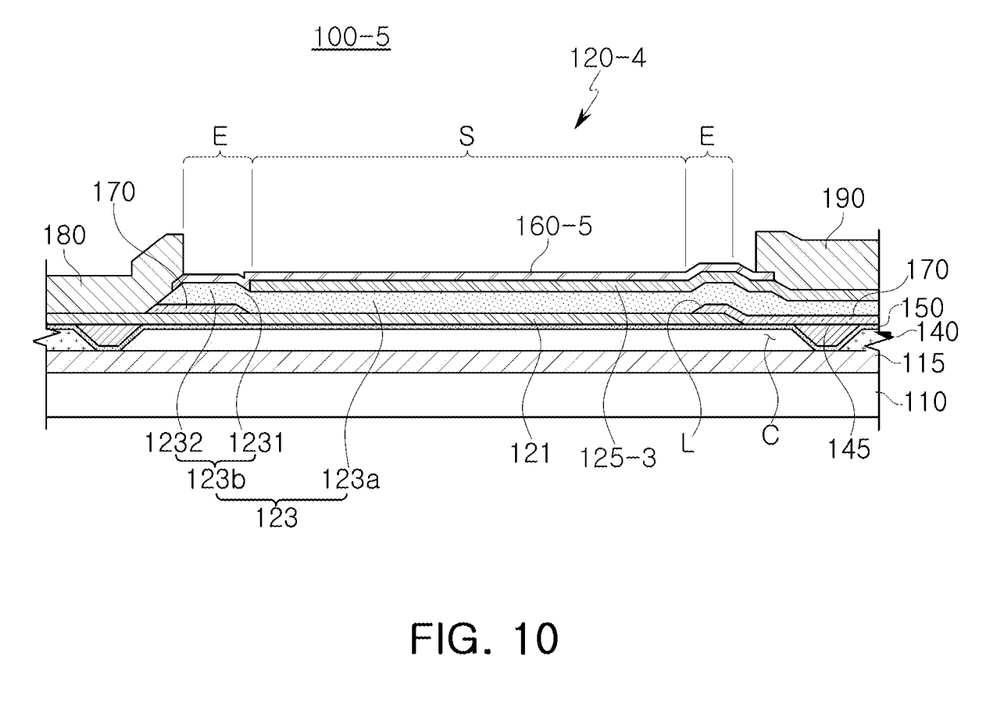
FIG. 10 is a cross-sectional view schematically illustrating a bulk-acoustic wave resonator, according to an embodiment.

FIG. 10 is a cross-sectional view schematically illustrating an acoustic wave resonator 100-5, according to an embodiment.

Referring to FIG. 10, in a cross-section of the acoustic wave resonator 100-5 cut to cross the central portion S of a resonator unit 120-4, an end portion of a second electrode 125-3 is formed only on an upper surface of the piezoelectric portion 123a of the piezoelectric layer 123, and is not formed on the bent portion 123b of the piezoelectric layer 123. Accordingly, the end portion of the second electrode 125-3 is disposed along the boundary between the piezoelectric portion 123a and the inclined portion 1231. A protective layer 160-5 is disposed on the second electrode 125-3, and is disposed in an area between the end portion of the second electrode 125-3 and the bent portion 123b of the piezoelectric layer 123.

As described above, a bulk-acoustic wave resonator according to embodiments disclosed herein may be modified in various forms, as necessary.

As set forth above, in a bulk-acoustic wave resonator disclosed herein, since heat generated in a piezoelectric layer is transferred to first and second metal layers through a protective layer having a relatively high thermal conductivity and is thereby released, a heat dissipation effect can be enhanced. Thus, even when high power is applied to the bulk-acoustic wave resonator, operational reliability can be ensured. Therefore, the bulk-acoustic wave resonator is suitable for use in 5G communication.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk-acoustic wave resonator, comprising:
   a substrate;
   a resonator unit comprising:
      a first electrode disposed on the substrate,
      a piezoelectric layer disposed on the first electrode, and
      a second electrode disposed on the piezoelectric layer; and
   a protective layer disposed on a surface of the resonator unit,
   wherein the protective layer is formed of a diamond film, and a grain size of the diamond film is 50 nm or more.

2. The bulk-acoustic wave resonator of claim 1, wherein the piezoelectric layer is formed of aluminum nitride (AlN) or aluminum nitride containing scandium (Sc).

3. The bulk-acoustic wave resonator of claim 2, wherein the second electrode is formed of molybdenum (Mo).

4. The bulk-acoustic wave resonator of claim 1, wherein the first electrode and the second electrode extend outside of the resonator unit,
   wherein a first metal layer is disposed on the first electrode outside of the resonator unit, and a second metal layer is disposed on the second electrode outside of the resonator unit, and
   wherein at least a portion of the protective layer is disposed to contact the first metal layer and the second metal layer.

5. The bulk-acoustic wave resonator of claim 4, wherein the at least a portion of the protective layer is disposed below the first metal layer and below the second metal layer.

6. The bulk-acoustic wave resonator of claim 5, wherein a region of the protective layer disposed below the first metal layer or below the second metal layer is thicker than a region of the protective layer disposed in the resonator unit.

7. The bulk-acoustic wave resonator of claim 4, wherein the first metal layer and the second metal layer are formed of any one of gold (Au), a gold-tin (Au—Sn) alloy, copper (Cu), a copper-tin (Cu—Sn) alloy, aluminum (Al), and an aluminum alloy.

8. The bulk-acoustic wave resonator of claim 1, wherein the second electrode has at least one opening, and
   a portion of the protective layer is disposed in the at least one opening and directly contacts the piezoelectric layer.

9. The bulk-acoustic wave resonator of claim 1, wherein the second electrode has at least one opening, and
   wherein a portion of the piezoelectric layer is disposed in the at least one opening and directly contacts the protective layer.

10. The bulk-acoustic wave resonator of claim 9, further comprising a support portion disposed below the piezoelectric layer, and partially raising the piezoelectric layer such that the portion of the piezoelectric layer is disposed in the at least one opening.

11. The bulk-acoustic wave resonator of claim 1, wherein the protective layer is formed of a material having a thermal conductivity higher than a thermal conductivity of the piezoelectric layer and a thermal conductivity of the second electrode.

12. The bulk-acoustic wave resonator of claim 1, further comprising an insertion layer partially disposed in the resonator unit, and disposed between the first electrode and the piezoelectric layer,
   wherein at least a portion of the piezoelectric layer is raised by the insertion layer.

13. The bulk-acoustic wave resonator of claim 12, wherein the second electrode has at least one opening, and
   wherein the insertion layer further comprises a support portion disposed in a region corresponding to a region of the opening.

14. The bulk-acoustic wave resonator of claim 12, wherein the insertion layer further comprises an inclined surface, and
   the piezoelectric layer comprises a piezoelectric portion disposed on the first electrode, and an inclined portion disposed on the inclined surface.

15. The bulk-acoustic wave resonator of claim 14, wherein in a cross-section of the resonator unit, an end of the second electrode is disposed on the inclined portion, or disposed along a boundary between the piezoelectric portion and the inclined portion.

16. The bulk-acoustic wave resonator of claim 14, wherein the piezoelectric layer further comprises an extension portion disposed outside of the inclined portion, and
   wherein at least a portion of the second electrode is disposed on the extension portion.

17. The bulk-acoustic wave resonator of claim 1, wherein the grain size of the diamond film is less than 1 µm.

18. The bulk-acoustic wave resonator of claim 1, further comprising:
   a first metal layer disposed on the first electrode outside of the resonator unit; and
   a second metal layer disposed on the second electrode outside of the resonator unit,
   wherein a first end portion of the protective layer is disposed directly between the first metal layer and the piezoelectric layer, and
   wherein a second end portion of the protective layer is disposed directly between the second metal layer and the second electrode.

* * * * *